(12) United States Patent
Ahonen et al.

(10) Patent No.: US 11,469,759 B2
(45) Date of Patent: Oct. 11, 2022

(54) QUBIT LEAKAGE ERROR REDUCTIONS

(71) Applicant: IQM Finland Oy, Espoo (FI)

(72) Inventors: Olli Ahonen, Espoo (FI); Johannes Heinsoo, Espoo (FI); Tianyi Li, Espoo (FI); Pasi Lähteenmäki, Espoo (FI); Mikko Möttönen, Espoo (FI); Jami Rönkkö, Espoo (FI); Jaakko Salo, Espoo (FI); Jorge Santos, Espoo (FI); Jani Tuorila, Espoo (FI)

(73) Assignee: IQM Finland Oy, Espoo (FI)

( * ) Notice: Subject to any disclaimer, the term of this patent is extended or adjusted under 35 U.S.C. 154(b) by 25 days.

(21) Appl. No.: 17/107,068

(22) Filed: Nov. 30, 2020

(65) Prior Publication Data

US 2022/0006458 A1 Jan. 6, 2022

(30) Foreign Application Priority Data

Jul. 6, 2020 (EP) .................................... 20184167

(51) Int. Cl.
*G06N 10/00* (2022.01)
*H03K 19/003* (2006.01)
(Continued)

(52) U.S. Cl.
CPC ....... *H03K 19/00346* (2013.01); *G06N 10/00* (2019.01); *H01L 23/38* (2013.01); *H01L 39/223* (2013.01); *H03H 7/0115* (2013.01)

(58) Field of Classification Search
CPC . H03K 19/00346; H01L 39/223; H01L 23/38; G06N 10/00; H03H 7/0115
See application file for complete search history.

(56) References Cited

U.S. PATENT DOCUMENTS

| 7,613,764 B1 | 11/2009 | Hilton et al. |
| 10,352,992 B1 | 7/2019 | Zeng et al. |

(Continued)

FOREIGN PATENT DOCUMENTS

| WO | 2013006375 A2 | 1/2013 |
| WO | 2019117949 A1 | 6/2019 |

OTHER PUBLICATIONS

Extended Search Report issued to EP20184167.3, dated Feb. 5, 2021, 11 pages.

(Continued)

*Primary Examiner* — Dinh T Le
(74) *Attorney, Agent, or Firm* — K&L Gates LLP

(57) ABSTRACT

An arrangement, an apparatus, a quantum computing system, and a method are disclosed for reducing qubit leakage errors. In an example, an apparatus includes a qubit having a ground state and a plurality of excited states. The plurality of excited states include a lowest excited state. An energy difference between the ground state and the lowest excited state corresponds to a first frequency, and an energy difference between the lowest excited state and another excited state in the plurality of excited states corresponds to a second frequency. The apparatus also includes an energy dissipation structure to dissipate transferred energy, and a filter having a stopband and a passband. The filter is coupled to the qubit and to the energy dissipation structure. The stopband includes the first frequency and the passband includes the second frequency for reducing qubit leakage errors.

18 Claims, 5 Drawing Sheets

(51) Int. Cl.
  *H01L 23/38* (2006.01)
  *H01L 39/22* (2006.01)
  *H03H 7/01* (2006.01)

(56) References Cited

U.S. PATENT DOCUMENTS

| | | | | |
|---|---|---|---|---|
| 2013/0009677 A1* | 1/2013 | Naaman | ............... | G06N 10/00 327/113 |
| 2016/0112031 A1* | 4/2016 | Abraham | ............... | H03K 17/92 327/528 |
| 2019/0023764 A1 | 8/2019 | Przybysz et al. | | |
| 2019/0237648 A1 | 8/2019 | Przybysz et al. | | |

OTHER PUBLICATIONS

Bronn et al., "Broadband filters for abatement of spontaneous emission in circuit quantum electrodynamics," Applied Physics Letters 107, Article published online Oct. 28, 2015, http://dx.doi.org/10.1063/1.4934867, 11 pages.
Sevriuk et al., "Fast control of dissipation in a superconducting resonator," Applied Physics Letters, Article published online Aug. 20, 2019, http://creativecommons.org/licenses/by/4.0, 4 pages.
Sete et al., "Quantum theory of bandpass Purcell filter for qubit readout," University of California, Riverside, dated Jul. 23, 2015, 15 pages.
Silveri et al., "Theory of quantum-circuit refrigeration by photon-assisted electron tunneling," dated Jun. 23, 2017, 15 pages.
International Search Report and Written Opinion issued to PCT/FI2021/050519 dated Dec. 16, 2021, 5 pages.
Muhonen et al. "Micrometer-scale refrigerators" Reports on Progress in Physics 2012, Mar. 22, 2012, p. 4.
Office Action issued to U.S. Appl. No. 17/107,262, dated Feb. 23, 2022, 22 pages.

\* cited by examiner

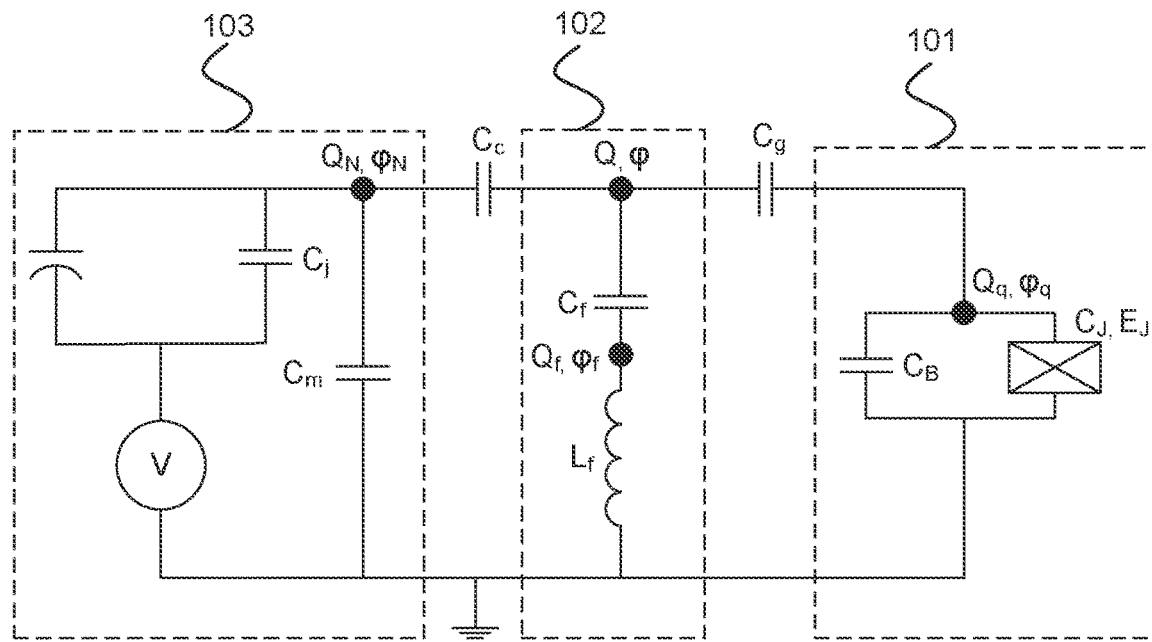

FIG. 6

| circuit parameters | | | |
|---|---|---|---|
| parameter | symbol | value | unitless value |
| qubit frequency | $\omega_{ge}$ | $2\pi$ 7.5 GHz | 1 |
| qubit anharmonicity | $\alpha$ | $2\pi$ 300 MHz | 0.04 ($\alpha/\omega_{ge}$) |
| QCR junct. cap. | $C_j$ | 55 fF | 1 ($C_j/C_f$) |
| QCR ground cap. | $C_m$ | 55 fF | 1 ($C_m/C_f$) |
| QCR-BSF cap. | $C_c$ | 5.5 pF | 100 ($C_c/C_f$) |
| QCR-BSF res. | $R_c$ | 1 mΩ | |
| BSF cap. | $C_f$ | 55 fF | 1 |
| BSF ind. | $L_f$ | 8.2 nH | |
| BSF res. | $R_f$ | 1 mΩ | |
| BSF-qubit cap. | $C_g$ | 5.5 pF | 100 ($C_g/C_f$) |
| BSF-qubit res. | $R_g$ | 1 mΩ | |
| qubit shunt cap. | $C_B$ | 22.5 fF | 1/2 ($C_B/C_f$) |
| qubit junct. cap. | $C_J$ | 22.5 fF | 1/2 ($C_J/C_f$) |
| QCR temp. | $T$ | 37.5 mK | |
| QCR effective res. | $R_{QCR}$ | 0.525 Ω | |

FIG. 7

QUBIT LEAKAGE ERROR REDUCTIONS

PRIORITY CLAIM

This application claims priority to European Patent Application No. 20184167.3, filed on Jul. 6, 2020, the entire disclosure of which is incorporated by reference herein.

TECHNICAL FIELD

The present disclosure relates to quantum computing, and more particularly to an arrangement for reducing qubit leakage errors in a quantum computing system.

BACKGROUND

Quantum computing is based on the idea of storing information in a two-level quantum system. However, many realizations of such quantum bits have more than two energy levels. In such cases, the qubit is formed by the two lowest energy levels and excitation of the higher levels is typically undesired. A qubit experiences leakage error when any of the higher energy levels become excited, i.e. when their quantum states mix with the lower energy levels used for quantum computing. Leakage error can happen as a result of applied gate operations or system-environment interactions. Leakage errors cannot be fixed with standard quantum error corrections, which only address errors within quantum computations.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

It is an objective to provide a system, an apparatus, and/or an arrangement for reducing qubit leakage errors in a quantum computing system. The foregoing and other objectives are achieved by the features recited in the independent claims. Further implementation forms are apparent from the dependent claims, the description, and the figures.

According to a first aspect, an arrangement or apparatus for reducing qubit leakage errors includes at least one qubit having a ground state and a plurality of excited states. The plurality of excited states includes a lowest excited state. An energy difference between the ground state and the lowest excited state corresponds to a first frequency and an energy difference between the lowest excited state and another excited state in the plurality of excited states corresponds to a second frequency. The arrangement or apparatus also includes an energy dissipation structure configured to dissipate energy transferred to the energy dissipation structure, and a filter having at least one stopband and at least one passband, The filter is coupled to the at least one qubit and to the energy dissipation structure. The at least one stopband includes the first frequency and the at least one passband includes the second frequency. The arrangement or apparatus may, for example, reduce leakage errors in the at least one qubit by permitting transitions at least from the other excited state to the lowest excited state while not permitting transitions between the lowest excited state and the ground state.

In an implementation form of the first aspect, the energy dissipation structure comprises at least one normal metal—insulator—superconductor (NIS) junction. The arrangement may, for example, efficiently dissipate photon energy from the qubit via the energy dissipation structure.

In a further implementation form of the first aspect, the energy dissipation structure comprises a quantum circuit refrigerator (QCR), where the QCR includes a voltage-biased superconductor—insulator—normal metal—insulator—superconductor (SINIS) junction. The arrangement may, for example, efficiently dissipate photon energy from the qubit via the energy dissipation structure and the dissipation may be controlled via a bias voltage.

In a further implementation form of the first aspect, the energy dissipation structure is configured to dissipate photon energy transferred to the energy dissipation structure via photon-assisted electron tunnelling in the NIS/SINIS junction.

In a further implementation form of the first aspect, the filter comprises a band-stop filter or a low-pass filter. The arrangement may, for example, block unwanted state transitions of the qubit while enabling state transitions that reduce leakage errors.

In a further implementation form of the first aspect, the at least one qubit comprises a superconductive qubit.

In a further implementation form of the first aspect, the other excited state comprises a second lowest excited state of the at least one qubit. The arrangement may, for example, permit relaxations from the second lowest excited state to the lowest excited state, thereby removing leakage errors due to energy in the second lowest excited state.

In a further implementation form of the first aspect, the at least one passband of the filter further comprises a third frequency corresponding to an energy difference between two states in the plurality of excited states. The arrangement may, for example, permit energy relaxations between the two states thus reducing leakage errors.

In a further implementation form of the first aspect, the at least one passband of the filter further comprises a first plurality of frequencies. Each frequency in the first plurality of frequencies corresponds to an energy difference between two consecutive excited states in the plurality of excited states of the at least one qubit. The arrangement may, for example, permit energy relaxations between consecutive excited states thus removing leakage errors via sequential relaxations between consecutive excited states.

In a further implementation form of the first aspect, the at least one stopband of the filter further comprises a second plurality of frequencies. Each frequency in the second plurality of frequencies corresponds to an energy difference between two non-consecutive states of the at least one qubit. The arrangement may, for example, restrict the at least one qubit to sequential energy relaxations, thereby causing more of the leakage error being retrieved in the lowest excited state instead of the ground state.

According to a second aspect, a quantum computing device comprises the arrangement according to the first aspect. The quantum computing device may, for example, perform quantum computations using the arrangement with reduced leakage errors.

According to a third aspect, a quantum computing system comprises the arrangement according to the first aspect and a control unit coupled to the arrangement. The control unit is configured to decouple the filter and/or the energy dissipation structure from the at least one qubit in response to a gate operation on the at least one qubit. The quantum computing system may, for example, mitigate any effects caused by the filter and/or the energy dissipation structure on the gate operation.

In an implementation form of the third aspect, the quantum computing system further comprises a plurality of arrangements. Each arrangement in the plurality of arrangements is implemented according to the first aspect. The control unit is coupled to each arrangement in the plurality of arrangements. Additionally, the control unit is further configured to decouple the filter and/or the energy dissipation structure of each arrangement in the plurality of arrangements from the at least one qubit of the arrangement in response to a gate operation on the qubit. The quantum computing system may, for example, mitigate any effects caused by the filter and/or the energy dissipation structure on the gate operation in each arrangement.

According to a fourth aspect, a method for qubit leakage error reduction using at least one arrangement according to the first aspect includes decoupling the filter and/or the energy dissipation structure from the at least one qubit. The method also includes performing at least one gate operation on the qubit. The method further includes recoupling the filter and/or the energy dissipation structure to the at least one qubit. The method may, for example, mitigate any effects caused by the filter and/or the energy dissipation structure on the gate operation.

In an implementation form of the fourth aspect, the at least one arrangement comprises a plurality of arrangements. The method further includes decoupling the filter and/or the energy dissipation structure from the at least one qubit in each arrangement in the plurality of arrangements, and performing at least one multi-qubit gate operation using the at least one qubit in each arrangement in the plurality of arrangements. The method additionally includes recoupling the filter and/or the energy dissipation structure to the at least one qubit in each arrangement in the plurality of arrangements. The method may, for example, mitigate any effects caused by the filter and/or the energy dissipation structure on the gate operation in each arrangement.

Many of the attendant features will be more readily appreciated based on the following detailed description provided in connection with the accompanying drawings.

DESCRIPTION OF THE DRAWINGS

In the following, example embodiments are described in more detail with reference to the attached figures and drawings, in which:

FIG. 6 illustrates an effective circuit model representation of the arrangement or apparatus, according to an embodiment;

FIG. 7 illustrates a table of circuit parameters, according to an embodiment;

In the following, like reference numerals are used to designate like parts in the accompanying drawings.

DETAILED DESCRIPTION

In the following description, reference is made to the accompanying drawings, which form part of the disclosure, and in which are shown, by way of illustration, specific aspects in which the present disclosure may be placed. It is understood that other aspects may be utilized, and structural or logical changes may be made without departing from the scope of the present disclosure. The following detailed description, therefore, is not to be taken in a limiting sense, as the scope of the present disclosure is defined by the appended claims.

For instance, it is understood that a disclosure in connection with a described method may also hold true for a corresponding device or system configured to perform the method and vice versa. For example, if a specific method step is described, a corresponding device may include a unit to perform the described method step, even if such unit is not explicitly described or illustrated in the figures. On the other hand, for example, if a specific apparatus is described based on functional units, a corresponding method may include a step performing the described functionality, even if such step is not explicitly described or illustrated in the figures. Further, it is understood that the features of the various example aspects described herein may be combined with each other, unless specifically noted otherwise.

Figure 1:
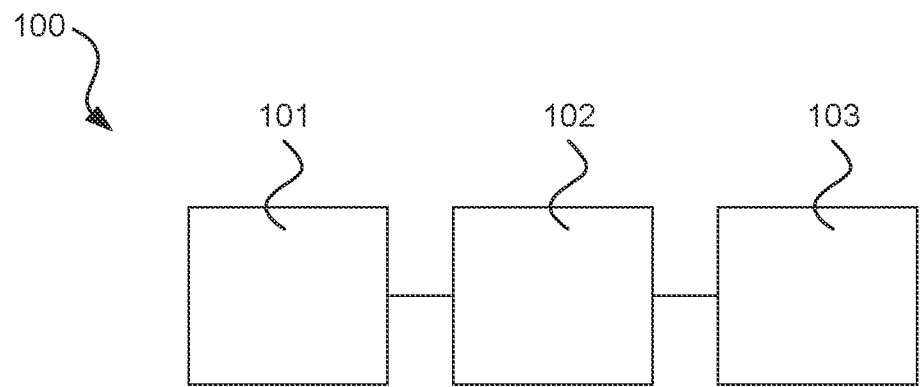
FIG. 1 illustrates a schematic representation of an arrangement or apparatus for reducing qubit leakage errors, according to an embodiment.

FIG. 1 illustrates a schematic representation of an arrangement 100 (or apparatus) for reducing qubit leakage errors, according to an embodiment. As shown in the illustrated embodiment, the arrangement 100 includes at least one qubit 101 having a ground state and a plurality of excited states. The plurality of excited states includes a lowest excited state. An energy difference between the ground state and the lowest excited state may correspond to a first frequency. An energy difference between the lowest excited state and another excited state in the plurality of excited states may correspond to a second frequency.

The order of states of the at least one qubit 101 are referred to herein using phrases such as "lowest", "second lowest", and "consecutive". These phrases may refer to the order of the states in relation to an energy level. For example, the ground state of the at least one qubit 101 may refer to a lowest state of the at least one qubit 101, meaning a state of the at least one qubit 101 with a lowest energy. Similarly, the lowest excited state of the at least one qubit 101 may refer to an excited state of the at least one qubit 101 with the lowest energy, and so on.

The first frequency may also be referred to as a resonance frequency of the at least one qubit 101. Herein, any energy E, such as an energy difference between states of the qubit 101, and a corresponding frequency ω may be related by the following equation:

$$E = \hbar$$

where $\hbar$ is the reduced Planck constant.

The other excited state may include, for example, a second lowest excited state of the at least one qubit 101, a third lowest excited state of the at least one qubit 101, or any other excited state in the plurality of excited states of the at least one qubit 101.

According to an embodiment, the at least one qubit 101 includes a superconductive qubit. Additionally or alternatively, the at least one qubit 101 includes at least one Josephson junction. According to another embodiment, the at least one qubit 101 includes a transmon qubit. Alternatively, the at least one qubit 101 may comprise any other type of qubit, such as a superconductive quantum interference device (SQUID) qubit, a flux qubit, a charge qubit, or a phase qubit.

Although some embodiments may be disclosed herein with reference to a certain type of at least one qubit 101, these qubit types are only exemplary. In any embodiment disclosed herein, the at least one qubit 101 may be implemented in various ways and using various technologies.

The arrangement 100 of FIG. 1 may further include an energy dissipation structure 103 configured to dissipate energy transferred to the energy dissipation structure 103. According to an embodiment, the energy dissipation structure 103 includes at least one normal metal—insulator—superconductor (NIS) junction. The energy dissipation structure 103 may be configured to dissipate photon energy transferred to the energy dissipation structure 103 via photon-assisted tunnelling in the NIS junction. According to another embodiment, the energy dissipation structure 103 includes a quantum circuit refrigerator (QCR).

The arrangement 100 of FIG. 1 may further include a filter 102 having at least one stopband and at least one passband. The filter 102 may be coupled to the at least one qubit 101 and to the energy dissipation structure 103. The at least one stopband may include the first frequency and the at least one passband may include the second frequency. The energy dissipation structure 103 coupled to the filter 102 results in a filtered energy dissipation structure. A filtered energy dissipation structure comprises a noise spectrum that contains at least a band or passband of allowed frequencies, where there noise spectrum is non-vanishing. The noise spectrum may also contain at least a gap or stopband of non-allowed frequencies, where the noise spectrum substantially vanishes. When a quantum system, such as the at least one qubit 101, is coupled to the filtered energy dissipation structure 103, the decay of the system energy levels separated by frequencies within the stopband can be suppressed, while the decay of the system energy levels separated by frequencies within the allowed band are allowed to occur.

The filter 102 may be, for example, electrically, capacitively, inductively, and/or electromagnetically coupled to the at least one qubit 101 and/or to the energy dissipation structure 103. The filter 102 may also be referred to as an electronic filter or similar. The filter 102 may comprise, for example, discrete elements, such as capacitors, inductors, resistors, and/or distributed elements embodied in, for example, transmission lines. Although some embodiments disclosed herein may depict the filter 102 as comprising certain components, these embodiments are only exemplary and the filter 102 may be implemented in various other ways.

The filter 102 may transfer energy from the at least one qubit 101 to the energy dissipation structure 103. The energy transfer may be selective based on the frequency response of the filter 102.

Although some examples of the filter 102 are disclosed in the embodiments herein, the filter 102 may also be implemented in various other ways and using various other components/elements. In any embodiment disclosed herein, the filter 102 may be implemented using, for example, any type of band-stop filter. For example, the filter 102 may be implemented using a more complex geometry corresponding to a higher order band-stop filter. Such a higher order band-stop filter may approximate a rectangular frequency response of an ideal band-stop filter.

The arrangement 100 of FIG. 1 may be embodied in, for example, a quantum computing device. Such a quantum computing device may comprise a plurality of qubits for performing quantum computations. Each such qubit may be implemented using the illustrated arrangement 100. The arrangement 100 may be realized, for example, in a superconducting circuit architecture.

The disclosed arrangement 100 may reduce leakage errors of the at least one qubit 101. A leakage error may occur when the at least one qubit 101 is excited to its second lowest (or higher) excited state. Thus, the state of the at least one qubit 101 leaks out of the computational basis that is formed by the ground state and lowest excited state. Typical error correcting protocols, such as surface code, can only fix bit and phase flip errors in the computational basis of the two lowest states, and cannot address leakage errors.

The arrangement 100 may also relax the unwanted higher excited states of the at least one qubit 101 via energy dissipation to the energy dissipation structure 103 while leaving the lowest excited state untouched. This may be referred to as targeted dissipation. Transitions from the lowest excited state to the ground state can be protected by the at least one stopband of the filter 102.

As provided herein, decay rates from the second lowest to the lowest excited state are presented as ($|f\rangle \rightarrow |e\rangle$), and from the lowest excited state to the ground state are presented as ($|e\rangle \rightarrow |g\rangle$)). The latter decay can be suppressed by at least one stopband of the filter 102 while the leakage-removing transition rate remains high. The effect of this method to a three-level truncated qubit that is subjected to an X-gate operation pulse are discussed herein. According to numerical results based on the Lindblad equation, the targeted dissipation reduces gate fidelity when the gate is applied to a qubit in the lowest excited state $|e\rangle$. To overcome this problem, it is possible to use a tuneable energy dissipation structure, such as a QCR, which enables a connection to the at least one qubit 101 to be switched off during gate operations.

Figure 2:
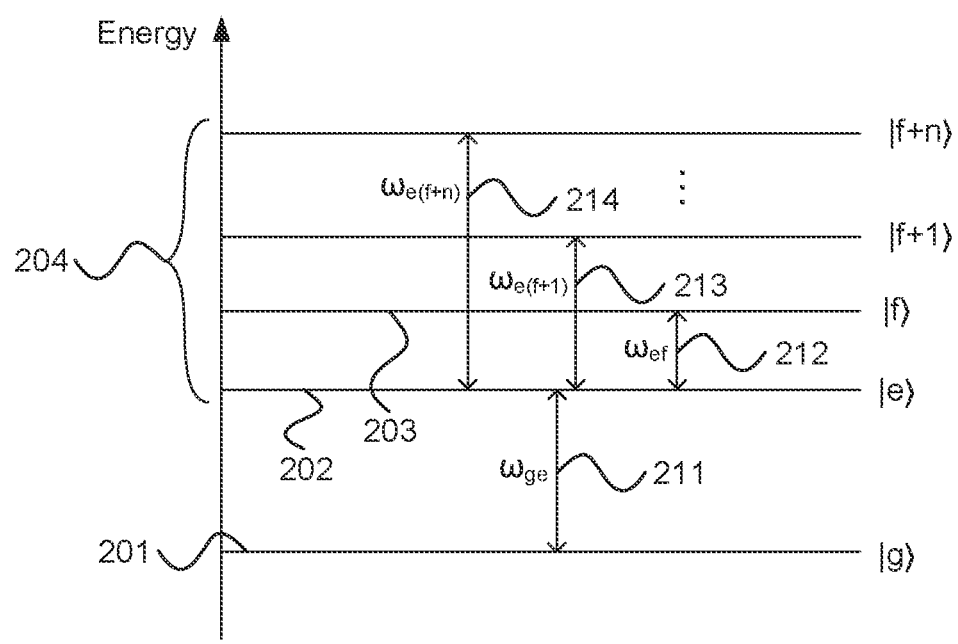
FIG. 2 illustrates a schematic representation of qubit energy levels, according to an embodiment.

FIG. 2 illustrates a schematic representation of qubit energy levels, according to an embodiment. The at least one qubit 101 may have a ground state $|g\rangle$ 201. As provided herein, the ground state 201 may refer to a quantum state of the at least one qubit 101 with the lowest energy.

The at least one qubit 101 may further have a plurality of excited states 204. The plurality of excited states 204 may comprise a lowest excited state $|e\rangle$ 202. As provided herein, the lowest excited state 202 may refer to a quantum state of the at least one qubit 101 with the second lowest energy.

The ground state 201 and the lowest excited state 202 of the at least one qubit 101 may correspond to the computational basis of the at least one qubit 101. For example, the ground state 201 may correspond to the $|0\rangle$ state of the at least one qubit 101 and the lowest excited state 202 may correspond to the $|1\rangle$ state of the at least one qubit 101 or vice versa.

An energy difference 211 between the ground state 201 and the lowest excited state 202 may correspond to a first frequency $\omega_{ge}$. The first frequency $\omega_{ge}$ may also be referred to as the resonance frequency of the at least one qubit 101.

The plurality of excited states 204 may further comprise a second lowest excited state |f⟩ 203. The second lowest excited state 203 has a higher energy than the ground state 201 and the lowest excited state 202.

As provided herein, any excited state above the second lowest excited state |f⟩ may be denoted by |f+k⟩, where k refers to the position of the state above the second lowest excited state |f⟩. For example, the third lowest excited state may be denoted by |f+1⟩ and so on.

The plurality of excited states 204 may comprise any number of excited states. In the embodiment of FIG. 2, four excited states are illustrated. However, as is denoted in FIG. 2, there may be any number of excited states between the state |f+1⟩ and the state |f+n⟩.

According to an embodiment, an energy difference 212 between the lowest excited state 202 and the second lowest excited state 203 corresponds to the second frequency $\omega_{ef}$. Alternatively, the second frequency may correspond to an energy difference 213, 214 between the lowest excited state 202 any other excited state in the plurality of excited states 204.

The at least one passband of the filter 102 may comprise the second frequency. An energy difference between the lowest excited state 202 and another excited state in the plurality of excited states 204 may correspond to the second frequency.

According to an embodiment, the other excited state includes a second lowest excited state 203 of the at least one qubit 101. Thus, the filter 102 may permit the at least one qubit 101 to relax from the second lowest excited state 203 to the lowest excited state 202 by transferring the corresponding energy to the energy dissipation structure 103.

According to an embodiment, the at least one passband of the filter 102 further comprises a third frequency corresponding to an energy difference between two states in the plurality of excited states 204. The third frequency may be different from the second frequency. Thus, the filter 102 may permit a relaxation between two states in the plurality of excited states 204 by transferring the corresponding energy to the energy dissipation structure 103.

According to an embodiment, the at least one passband of the filter 102 further includes a first plurality of frequencies. Each frequency in the first plurality of frequencies may correspond to an energy difference between two consecutive or non-consecutive excited states in the plurality of excited states 204 of the at least one qubit 101. Thus, the filter 102 may permit transitions between two consecutive states in the plurality of excited states 204. The at least one qubit 101 may accordingly relax from an excited state in the plurality of excited states 204 to the computational basis via a plurality of transitions between consecutive excited states.

Since the at least one stopband of the filter 102 may comprise the first frequency $\omega_{ge}$, the filter 102 and/or the energy dissipation structure 103 may not significantly affect the operation of at least one qubit 101 when the at least one qubit 101 is in the ground state 201, in the lowest excited state 202, or in a superposition thereof. On the other hand, since the at least one passband of the filter 102 may include the second frequency, when the at least one qubit 101 is in another excited state, such as the second lowest excited state 203, energy may be transferred from the at least one qubit 101 to the energy dissipation structure 103 via the filter 102. Thus, the at least one qubit 101 may relax from the other excited state to the lowest excited state 202, thus returning to the computational basis and reducing leakage errors.

Figure 3:
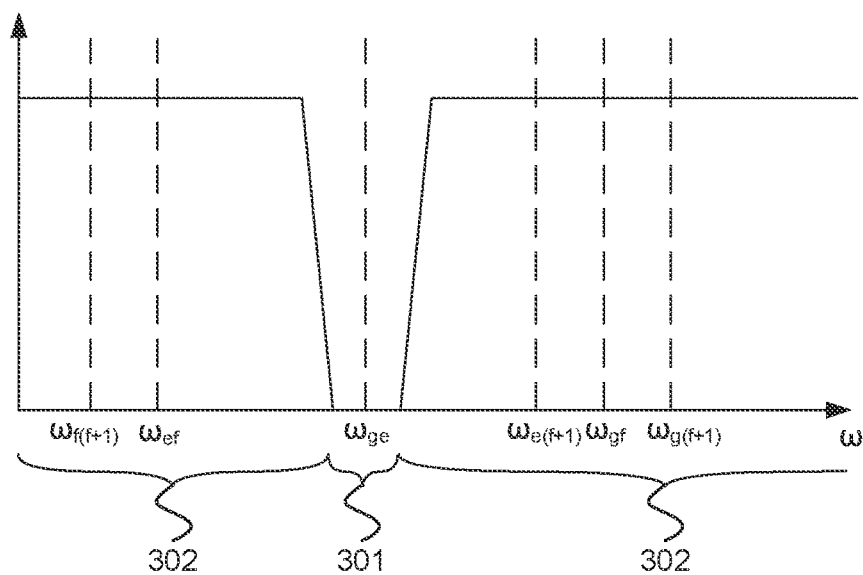
FIG. 3 illustrates a schematic representation of a frequency response of a band-stop filter, according to an embodiment.

FIG. 3 illustrates a schematic representation of a frequency response of a band-stop filter (e.g., the filter 102), according to an embodiment. The frequency response illustrated in the embodiment of FIG. 3 is only exemplary and may not represent a physically realisable frequency response.

According to an embodiment, the filter 102 includes a band-stop filter. In the embodiment of FIG. 3, at least one stopband 301 of the filter 102 includes the first frequency $\omega_{ge}$. Thus, the filter 102 may prevent energy transfer from the at least one qubit 101 to the energy dissipation structure 103 at the first frequency $\omega_{ge}$. Therefore, the filter 102 does not cause transitions from the lowest excited state 202 to the ground state 201. As such, the filter 102 does not substantially affect the computational basis of the at least one qubit 101.

At least one passband 302 of the filter 102, on the other hand, may include frequencies corresponding to various other transitions between the states of the at least one qubit 101. In the embodiment of FIG. 3, two frequencies $\omega_{f(f+1)}$, $\omega_{ef}$ corresponding to energy differences between excited states of the at least one qubit 101 are illustrated. Since these energy differences are smaller than the energy difference between |g⟩ and |e⟩, the corresponding frequencies are lower than the first frequency $\omega_{ge}$. Also, since the at least one passband 302 of the filter 102 includes these frequencies, the corresponding relaxations may occur in the at least one qubit 101, which can reduce leakage errors.

The at least one passband 302 of the filter 102 further comprises frequencies that correspond to larger energy differences than the gap between |g⟩ and |e⟩. Three such frequencies, $\omega_{e(f+1)}$, $\omega_{gf}$, and $\omega_{g(f+1)}$, are illustrated in the embodiment of FIG. 3. Thus, the filter 102 may also enable direct transitions from the higher excited states to the ground state 201, which may further reduce leakage errors in the at least one qubit 101.

Figure 4:
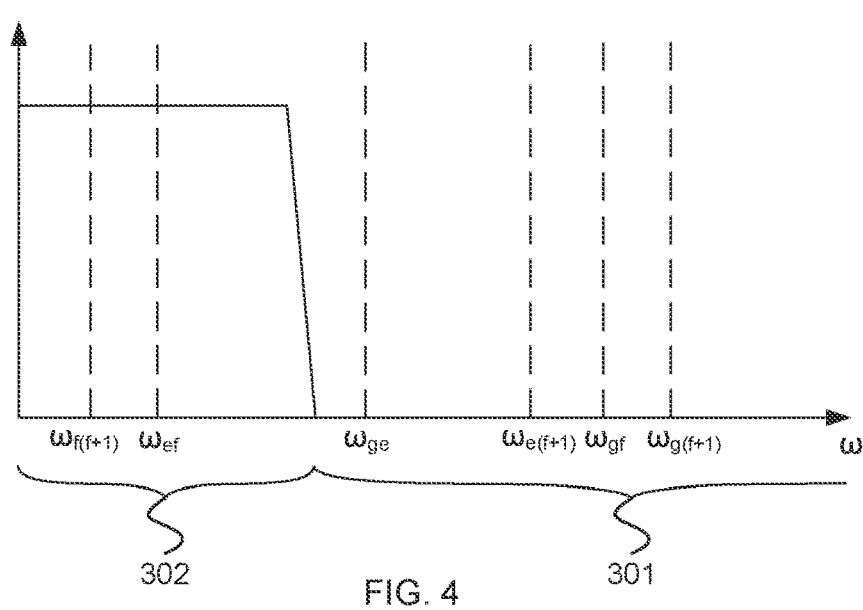
FIG. 4 illustrates a schematic representation of a frequency response of a low-pass filter, according to an embodiment.

FIG. 4 illustrates a schematic representation of a frequency response of a low-pass filter, according to an embodiment. The frequency response illustrated in the embodiment of FIG. 4 is only exemplary and may not represent a physically realisable frequency response.

According to an embodiment, the filter 102 comprises a low-pass filter. Since the anharmonicity of the at least one qubit 101 may render the gaps between successive excited states smaller than the first frequency $\omega_{ge}$, it may be sufficient to implement the filter 102 using a low-pass filter instead of a band-stop filter.

Similar to the band-stop filter of the embodiment of FIG. 3, a low-pass filter may enable transitions between the excited states of the at least one qubit 101 since the frequencies $\omega_{f(f+1)}$, $\omega_{ef}$ are in the at least one passband of the filter 102. On the other hand, since the higher frequency transitions, such as $\omega_{e(f+1)}$, $\omega_{gf}$, and $\omega_{g(f+1)}$, are in the at least one stopband 301 of the filter 102, these transitions may not occur and cannot be therefore used to remove leakage errors. On the other hand, by restricting the at least one qubit 101 to sequential transitions, the low-pass filter of FIG. 4 could guarantee that all the leakage error is retrieved in the |e⟩ state instead of the |g⟩ state. According to an embodiment, the at least one stopband 301 of the filter 102 further comprises a second plurality of frequencies. Each frequency in the second plurality of frequencies corresponds to an energy difference between two non-consecutive states of the at least one qubit 101.

Figure 5:
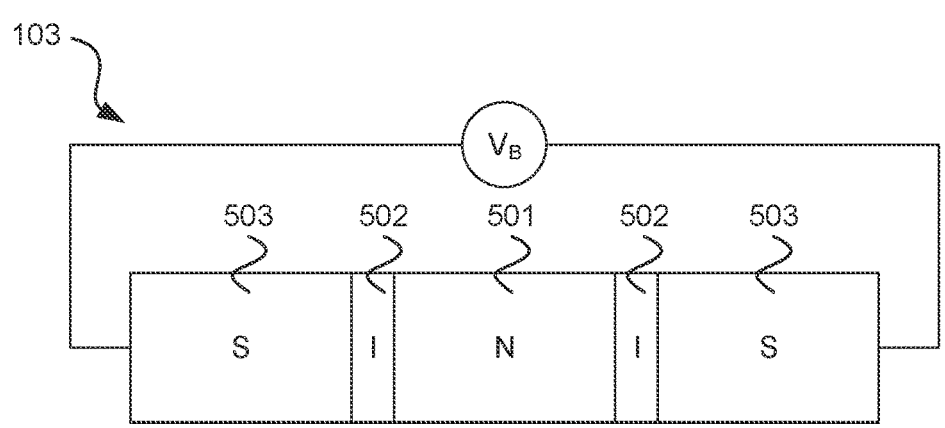
FIG. 5 illustrates a schematic representation of an energy dissipation structure, according to an embodiment.

FIG. 5 illustrates a schematic representation of an energy dissipation structure 103, according to an embodiment. In the illustrated embodiment, the energy dissipation structure 103 includes at least one normal metal 501—insulator 502—superconductor 503 (NIS) junction. The NIS junction may be voltage-biased.

For example, in the embodiment of FIG. 5, the energy dissipation structure 103 includes two NIS junctions. These two NIS junctions form a superconductor—insulator—normal metal—insulator—superconductor (SINIS) junction. The SINIS junction may be biased by a bias voltage $V_B$. The normal metal 501 may be charged and discharged by controlling the bias voltage $V_B$, which causes electron tunnelling across the insulating barriers 502. These tunnelling transitions may also involve absorption or emission of photons. The SINIS junction may be referred to as a quantum circuit refrigerator (QCR).

The filter 102 may be coupled to the normal metal 501 of the NIS/SINIS junction. Thus, the energy dissipation structure 103 may absorb photon energy from the at least one qubit 101 via the filter 102.

According to an embodiment, the energy dissipation structure 103 comprises a QCR, where the QCR includes a SINIS junction. According to another embodiment, the energy dissipation structure 103 is configured to dissipate photon energy transferred to the energy dissipation structure 103 via photon-assisted electron tunnelling in the NIS/SINIS junction.

FIG. 6 illustrates a circuit model representation of the arrangement 100, according to an embodiment. It should be appreciated that the arrangement 100 may not comprise the circuit elements illustrated in the embodiment of FIG. 6. Rather, the circuit elements illustrated in the embodiment of FIG. 6 may represent the electrical properties of the at least one qubit 101, the filter 102, and/or the energy dissipation structure 103. In some instances, the circuit elements illustrated in the embodiment of FIG. 6 can be used to analyse the behaviour of the arrangement 100.

In the embodiment of FIG. 6, the energy dissipation structure 103 includes a QCR. The QCR is modelled as a NIS junction with capacitance $C_j$ and a voltage bias that is equal to $V=V_B/2$. Tunnelling through this NIS junction is modelled by the tunnel junction in parallel with capacitance $C_j$. The second NIS junction of the QCR is omitted and its contribution to the tunnelling through the NIS junction is included in the capacitance $C_m$ of the normal metal to the ground.

In the embodiment of FIG. 6, the filter 102 includes an LC band-stop filter. The filter 102 is modelled by the capacitance $C_c$, which is electrically coupled to the QCR. The filter 102 is also modelled by the series capacitance $C_f$ and inductance $L_f$ connected to the ground.

In the embodiment of FIG. 6, the at least one qubit 101 includes a transmon qubit. The at least one qubit 101 comprises capacitances $C_B$ and $C_J$, and Josephson energy $E_J$. The at least one qubit 101 is capacitively coupled to the filter 102 with capacitance $C_g$.

The node fluxes of the normal metal island of the QCR, the two nodes on the filter 102 and the node at least one qubit 101 are denoted by $\phi_N$, $\phi$, $\phi_f$, and $\phi_q$, respectively, along with their conjugate node charges $Q_N$, $Q$, $Q_f$, and $Q_q$.

As a first approximation, the band-stop filter 102 may be modelled by a first order lumped-element LC filter. The arrangement 100 includes a QCR connected to an LC band-stop filter that is capacitively connected to the at least one qubit 101. Thus, the band-stop filter 102 and the QCR form a band-stop filtered QCR. The band-stop filtered QCR is an example of a filtered energy dissipation structure. In the following, the canonical approach is followed by noting the system Lagrangian and deriving from it a Hamiltonian expressed in terms of node fluxes and charges that are elevated to quantum operators.

The transition rates from $|f\rangle$ to $|e\rangle$ and from $|e\rangle$ to $|g\rangle$ are calculated as predicted by the Hamiltonian when the QCR and the band-stop filter are considered as an environment for the at least one qubit 101. This involves solving the noise spectral density of the environment formed by QCR and the filter 102, which is done using classical circuit analysis.

The Lagrangian L of the system may be expressed as:

$$\mathcal{L} = C_j \frac{(\dot{\phi}_N - V)^2}{2} + C_m \frac{\dot{\phi}_N^2}{2} + C_c \frac{(\dot{\phi}_N - \dot{\phi})^2}{2} + C_f \frac{(\dot{\phi} - \dot{\phi}_f)^2}{2} +$$
$$C_g \frac{(\dot{\phi} - \dot{\phi}_q)^2}{2} + (C_B + C_J) \frac{\dot{\phi}_q^2}{2} - \frac{\phi_f^2}{2L_f} + E_J \cos\left(\frac{2\pi \phi_q}{\phi_Q}\right),$$

where $\phi_Q$ is the flux quantum and $\dot{\phi}_i$ denotes the time derivative of the node flux $\phi_i$. The quantum mechanical Hamiltonian of the system can be obtained from the Lagrangian by defining the node charges $Q_i$ as generalised momentum of the node fluxes $\phi_i$, performing a Legendre transformation, and elevating the degrees of freedom to operators $\phi_i \rightarrow \hat{\phi}_i$ and $Q_i \rightarrow \hat{Q}_i$. This yields the system Hamiltonian expressed below:

$$\hat{H} = \frac{(\hat{Q}_N + C_j V)^2}{2C_{Q_N}} + \frac{\hat{Q}_f^2}{2C_{Q_f}} + \frac{\hat{Q}_q^2}{C_{Q_q}} + \frac{(\hat{Q}_N + C_j V)\hat{Q}_f}{C_{Q_N Q_f}} +$$
$$\frac{(\hat{Q}_N + C_j V)\hat{Q}_q}{C_{Q_N Q_q}} + \frac{\hat{Q}_f \hat{Q}_q}{2C_{Q_f Q_q}} + \frac{\hat{\phi}^2}{2L_f} - E_J \cos\left(\frac{2\pi \hat{\phi}_q}{\phi_Q}\right)$$

where $$C_{Q_N} = \frac{C_4}{C_B C_c C_f + C_B C_f C_g + C_c C_f C_g + C_c C_f C_J + C_f C_g C_J}$$

$$C_{Q_f} = \frac{C_4}{-C_g^2(C_c + C_j + C_m) + (C_B + C_g + C_J)}$$
$$(-C_c^2 + (C_c + C_f + C_g)(C_c + C_j + C_m))$$

$$C_{Q_q} = \frac{C_4}{C_c C_f C_g + C_c C_f C_J + C_f C_g C_J + C_c C_f C_m + C_f C_g C_m}$$

$$C_{Q_N Q_f} = \frac{2C_4}{C_c C_f (C_B + C_g + C_j) + C_B C_c C_f + C_c C_f C_g + C_c C_f C_J}$$

$$C_{Q_N Q_q} = \frac{C_4}{C_c C_f C_g}$$

$$C_{Q_f Q_q} = \frac{C_4}{C_f C_g (C_c + C_j + C_m)}$$

and $$C_4 = -C_f C_g^2 (C_c + C_j + C_m) + (C_B + C_g + C_J)$$
$$(C_c C_f C_g + C_c C_f C_J + C_f C_g C_J + C_c C_f C_m + C_f C_g C_m).$$

The node variables $\phi_i$ and $Q_i$ do not appear in the Hamiltonian, since Q is a constant of motion.

Fermi's golden rule may be used to calculate the environment-induced decay rates of the three-level transmon, as shown below:

$$\Gamma_{i \to j} = \frac{|\langle f|\hat{Q}_{int}|i\rangle|^2}{\hbar^2} S_{QCR+BSF}(-\omega_{if})$$

where $\hat{Q}_{int}$ is the charge-transfer operator that takes charge from the initial eigenstate i of the qubit to another eigenstate f. $S_{SQR+BSF(-\omega_{if})}$ is the voltage noise spectrum of band-stop filtered QCR and $\omega_{if}$ is the frequency difference of the final state and the initial state. In view of this, the Hamiltonian can be divided into system $\hat{H}_{sys}$, environment $\hat{H}_{env}$, and interaction $\hat{H}_{int}$ parts:

$$\hat{H}_{sys} = \frac{\hat{Q}_q^2}{C_{Q_q}} - E_J \cos\left(\frac{2\pi\hat{\phi}_q}{\phi_Q}\right)$$

$$\hat{H}_{env} = \frac{(\hat{Q}_N + C_j V)^2}{2C_{Q_N}} + \frac{\hat{Q}_f^2}{2C_{Q_f}} + \frac{(\hat{Q}_N + C_j V)\hat{Q}_f}{C_{Q_N Q_f}} + \frac{\hat{\phi}_f^2}{2L_f}$$

$$\hat{H}_{int} = +\frac{(\hat{Q}_N + C_j V)\hat{Q}_q}{C_{Q_N Q_q}} + \frac{\hat{Q}_f \hat{Q}_q}{2C_{Q_f Q_q}}$$

The system Hamiltonian can be written in its eigenbasis $|k\rangle$ up to third level as $$\hat{H}_0 = \hbar\omega_{ge}|e\rangle\langle| + \hbar(2\omega_{ge}-\alpha)|f\rangle\langle f|,$$

where the frequency of the ground state is set to zero, $\omega_{ge}$ is the resonance frequency of the at least one qubit 101, and $\alpha$ is the anharmonicity of the f energy level.

The charge transfer operator $\hat{Q}_{int}$ may be expressed as:

$$\hat{Q}_{int} = \left(\frac{C_{Q_N}}{C_{Q_N Q_q}} + \frac{C_{Q_N}}{C_{Q_f Q_q}}\right)\hat{Q}_q,$$

and $\hat{Q}_q$ can be expressed in the transmon eigenbasis as:

$$\hat{Q}_q = 2e(|e\rangle\langle g|+|g\rangle\langle e|+|e\rangle\langle f|+|f\rangle\langle e|),$$

where the "ket-bras" $|f\rangle\langle i|$ cause sequential transitions between adjacent energy levels and 2e is the charge of a Cooper pair.

The voltage noise spectrum of the band-stop filtered QCR can be obtained by solving the voltage response of the filter 102 $H(\omega) = V_{out}(\omega)/V_{in}(\omega)$, and using this relation to express the voltage noise after the filter 102 as $V_{out}(\omega) = H(\omega)V_{in}(\omega)$, where $V_{in}(\omega)$ is the noise voltage of the QCR. The noise of the QCR alone is obtained from the fluctuation-dissipation theorem. Hence, the voltage noise spectrum of band-stop filtered QCR is:

$$S_{QCR+BSF}(\omega) = \frac{1}{2\pi t}\langle V_{QCR+BSF}(-\omega)V_{QCR+BSF}(\omega)\rangle =$$

$$\frac{1}{2\pi t}\langle H(-\omega)V_{QCR}(-\omega)H(\omega)V_{QCR}(\omega)\rangle =$$

$$H(-\omega)H(\omega) \times \frac{1}{2\pi t}\langle V_{QCR}(-\omega)V_{QCR}(\omega)\rangle \approx$$

$$\frac{(\omega_f^2-\omega^2+iR_f\omega/L_f)(\omega_f^2-\omega^2-iR_f\omega/L_f)}{w_f^4+\omega^4+(R_c+R_f)^2\omega^2/L_f^2-2\omega^2\omega_f^2} \times \frac{4\hbar\omega R_{QCR}}{1-e^{-\hbar\omega/k_B T}}$$

where in the last line, the product of transfer functions is noted explicitly, and the result of fluctuation-dissipation theorem is used. $\omega_f = 1/\sqrt{C_f L_f}$ is the central rejected frequency. Additionally, $R_f$ and $R_c$ are the series resistances of the filter and the QCR-filter coupling conductor. The resistances arise, for example, from losses of dielectrics and are needed to maintain the Q-factor of the LC-circuit finite. The approximate equality follows from approximations based on relation $C_c \gg C_f$.

FIG. 7 illustrates a table of circuit parameters, according to an embodiment. The circuit parameters are only exemplary and are intended to illustrate that the filter 102 can protect the e→g transition while enabling the leakage error at the f-state to decay in an f→e transition. The effective resistance of the QCR is set such that the QCR-induced relaxation rate is in nanoseconds.

Inserting the expressions for $\hat{Q}_q$ and $S_{QCR+BSF}(\omega)$ and frequencies $\omega_{ge}$ and $\omega_{ef} = 2\omega_{ge}-\alpha$ to the Fermi's golden rule yields the following decay rates:

$$\Gamma_{f \to e} = \frac{|\langle e|\hat{Q}_{int}|f\rangle|^2}{\hbar^2} S_{QCR+BSF}(-\omega_{ef}) \approx 280 \text{ MHz} \Rightarrow \tau_{f \to e} \approx 3.5 \text{ ns}$$

and $$\Gamma_{e \to g} = \frac{|\langle g|\hat{Q}_{int}|e\rangle|^2}{\hbar^2} S_{QCR+BSF}(-\omega_{ge}) \approx 51 \text{ Hz} \Rightarrow \tau_{e \to g} \approx 0.02 \text{ s}$$

The decay rates above indicate that a band-stop filter can efficiently protect the computational basis from decaying while allowing the QCR to quickly deplete the second lowest excited state. The decay process of f→g is ignored in the analysis based on the fact that transitions with even differences between the states are exponentially suppressed because of parity.

In the following, the effect of the band-stop filtered QCR on the time-evolution of a driven three-level truncated transmon is discussed. The Hamiltonian of the system includes the transmon and drive terms, and is represented in the ordered basis $\{|g\rangle|e\rangle|f\rangle\}$, as shown in the following matrix:

$$\hat{H}_{sys}(t) = \begin{pmatrix} 0 & \hbar\Omega\sin(\omega_d t) & 0 \\ \hbar\Omega\sin(\omega_d t) & \hbar\omega_e & \sqrt{2}\hbar\Omega\sin(\omega_d t) \\ 0 & \sqrt{2}\hbar\Omega\sin(\omega_d t) & \hbar\omega_f \end{pmatrix},$$

where the ground state energy is set to zero and the energy of the $|f\rangle$ state is, in terms of the first excited state energy $\hbar\omega_e$ and an anharmonicity $\hbar\alpha$, $\hbar\omega_f = 2\hbar\omega_e - \hbar\alpha$. The duration of coherent transitions between the basis states are dictated by the Rabi frequency $\Omega$. Selective driving is made possible by choosing the frequency of the driving field $\omega_d$ to match the energy difference between the target states. Additionally, the duration of the drive is given by the time parameter t.

The dissipative time-evolution is modelled using the Lindblad master equation, where the amplitudes of the dissipation terms are given by the decay rates $\Gamma_{f \to e}$ and $\Gamma_{e \to g}$ calculated above. For a vectorized form of the density matrices, $\vec{\rho} = [\rho_{11}, \rho_{21}, \rho_{31}, \rho_{12}, \rho_{22}, \rho_{32}, \rho_{13}, \rho_{23}, \rho_{33}]^T$, the Lindblad equation yields the following time-evolution superoperator:

$$\tilde{U}(t, t_0) = \mathcal{T} \exp\left(\int_{t_0}^{t} -\frac{i}{\hbar}\tilde{H}(\tau) + \tilde{G}d\tau\right)$$

where $$\tilde{H}(t) = \hat{H}_{sys}(t) \otimes \hat{I} - \hat{I} \otimes \hat{H}_{sys}(t)$$

is a superoperator corresponding to the coherent von Neumann part $[\hat{H}_{sys}(t), \rho(t)]$ and $$\tilde{G} = \sum_{f \to e, e \to g} \hat{L}_i \otimes \hat{L}_i - \frac{1}{2}\hat{I} \otimes \hat{L}_i^\dagger \hat{L}_i - \frac{1}{2}\hat{L}_i^\dagger \hat{L}_i \otimes \hat{I}$$

is a Lindblad generator with Lindblad operators $\hat{L}_{f \to e} = \rangle \Gamma_{f \to e} |e\rangle \langle \hat{L}_{e \to f} = \sqrt{\Gamma_{e \to f}}|f\rangle\langle e|$, $\hat{L}_{g \to e} = \sqrt{\Gamma_{g \to e}}|e\rangle\langle g|$ and $\hat{L}_{g \to e} = \sqrt{\Gamma_{g \to e}}|e\rangle\langle g|$. $\hat{I}$ is the 3×3 identity matrix and $\otimes$ signifies the tensor (Kronecker) product of matrices.

Being superoperator itself, the propagator of the superoperator equation above gives the (vectorized) density matrix $\vec{\rho}(t)$ of the system at a time t as a matrix multiplication of the vectorized initial state $\vec{\rho}(t_0)$, expressed as:

$$\vec{\rho}(t) = \tilde{U}(t, t_0)\vec{\rho}(t_0).$$

The cumbersome Dyson series of the superoperator equation may be approximated by the following product of matrix exponentials (each corresponding to an evolution lasting for a short time dt):

$$\tilde{U}(t, t_0) \approx \prod_{n=0}^{N} \exp\left(\left(-\frac{i}{\hbar}\tilde{H}(ndt) + \tilde{G}\right)dt\right),$$

where N=t/dt-1.

Figure 8:
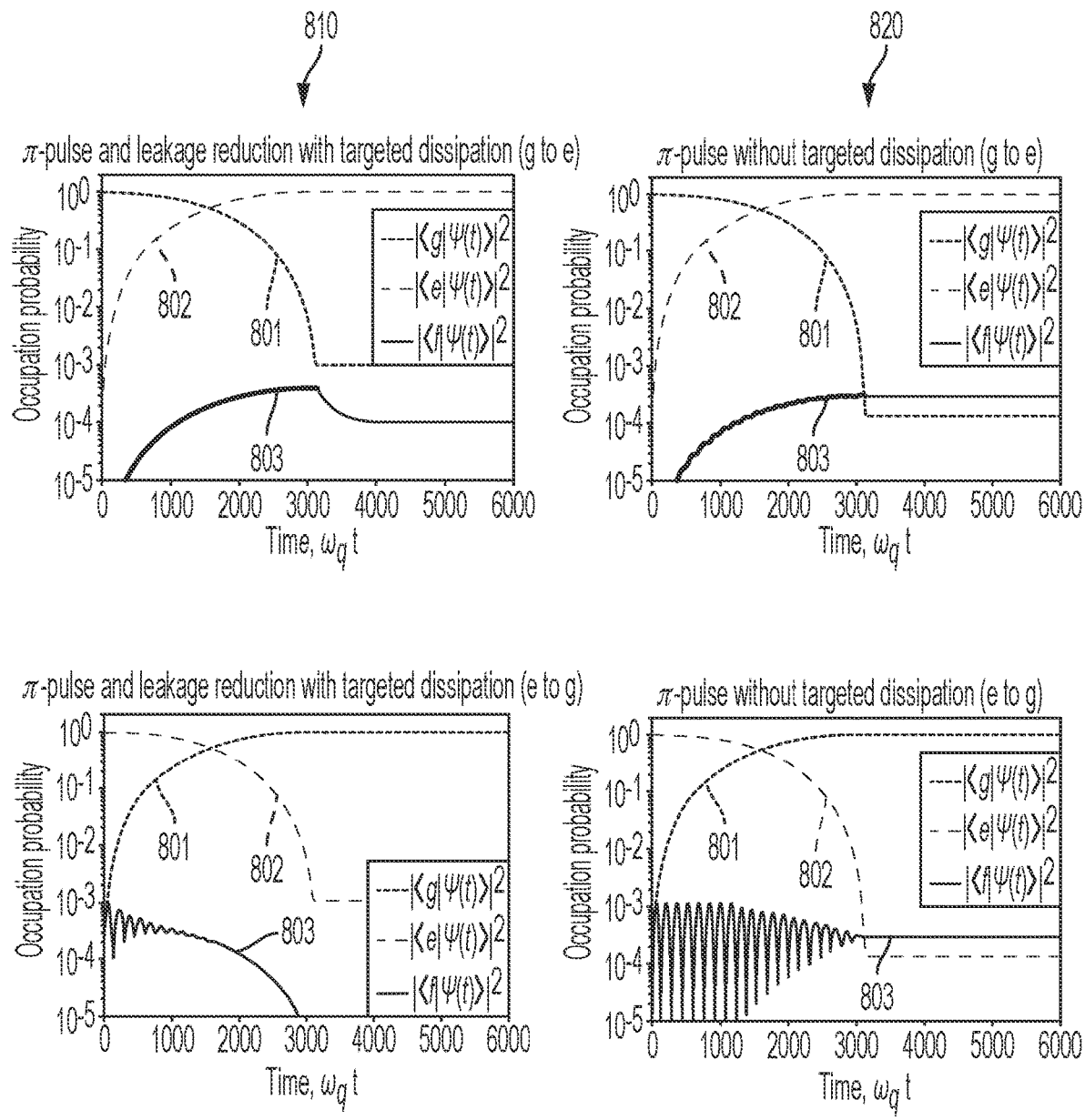
FIG. 8 illustrates a plot representation of qubit eigenstate occupation during gate operation, according to an embodiment.

FIG. 8 illustrates a plot representation of qubit eigenstate occupation during gate operation, according to an embodiment. In addition to the excitations induced by the environment, leakage due to driving fields may be a major cause of leakage errors. FIG. 8 illustrates the effect of a band-stop filtered QCR on a qubit undergoing an X-gate operation i.e. being subjected to a π-pulse.

The plots of FIG. 8 depict the time-evolution of a three-level transmon qubit undergoing a π-pulse in resonance ($\omega_d = \omega_{eg}$) with g→e and e→g transitions, and then idling. FIG. 8 illustrates the results for a typical Rabi frequency of $\Omega = 10^{-3}\omega_{eg}$ corresponding to a pulse duration $t = 1000\pi/\omega_{eg}$ (approximately 67 ns). Curve 801 corresponds to the ground state $|g\rangle$), curve 802 corresponds to the lowest excited state $|e\rangle$, and curve 803 corresponds to the second lowest excited state $|f\rangle$.

The left column plots 810 show embodiments with a band-stop filtered QCR and the right column plots 820 show the evolution without a band-stop filtered QCR.

If one considers a maximal fidelity, a π-pulse applied to a qubit initially in the ground state, like in the upper panels of FIG. 8, or the first excited state, like in the lower panels of FIG. 8, the qubit is flipped to the excited state and ground state, respectively. Comparison of the plots with and without dissipation reveals that the dissipation increases the infidelity of the gate by an order of magnitude. However, when the pulse has ended, the leakage occupation of the $|f\rangle$ state begins to relax, particularly when the initial state is the excited state $|e\rangle$, while the relaxation of the excited state $|e\rangle$ is impeded by the band-stop filter.

Figure 9:
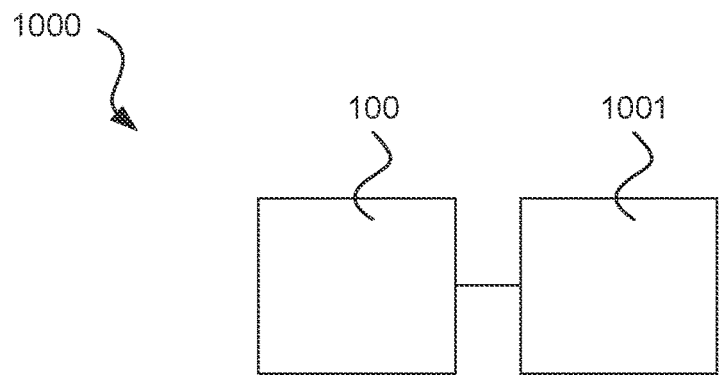
FIG. 9 illustrates a schematic representation of a quantum computing system, according to an embodiment.

FIG. 9 illustrates a schematic representation of a quantum computing system 1000, according to an embodiment. According to the illustrated embodiment, the quantum computing system 1000 comprises the arrangement 100 and a control unit 1001 coupled to the arrangement 100. The control unit 1001 may be configured to decouple the filter 102 and/or the energy dissipation structure 103 from the at least one qubit 101 in response to a gate operation on the at least one qubit 101. The gate operation may be performed by the control unit 1001 or by some other device in the quantum computing system 1000.

The filter 102 and/or the energy dissipation structure 103 may be coupled to the at least one qubit 101 via a controllable coupling. The control unit 1001 may be coupled to the controllable coupling and the control unit 1001 may be configured to decouple the filter 102 and/or the energy dissipation structure 103 from the at least one qubit 101 via the controllable coupling in response to a gate operation on the at least one qubit 101. For example, in embodiments where the energy dissipation structure 103 comprises a NIS/SINIS junction, the control unit 1001 may be configured to decouple the energy dissipation structure 103 by adjusting the bias voltage $V_B$. A gate operation may refer to a quantum logic gate operation, such as X-gate, Y-gate, Z-gate, Hadamard gate, or phase gate, performed on the at least one qubit 101.

Decoupling the filter 102 and/or the energy dissipation structure 103 from the at least one qubit 101 may prevent the filter 102 and/or the energy dissipation structure 103 from affecting the computational basis of the at least one qubit 101. Although, according to the analysis above, this may not be required in some cases, such as with slow decay rates, it may be beneficial in some other situations.

When the system 1000 is operational, the arrangement 100 may be physically located in a cryostat or similar. The cryostat may cool the at least one qubit 101 and other components of the arrangement 100, such as the energy dissipation structure 103, to cryogenic temperatures. This may be required if the at least one qubit 101 comprises, for example, a superconductive qubit. The control unit 1001 may be located outside the cryostat.

Figure 10:
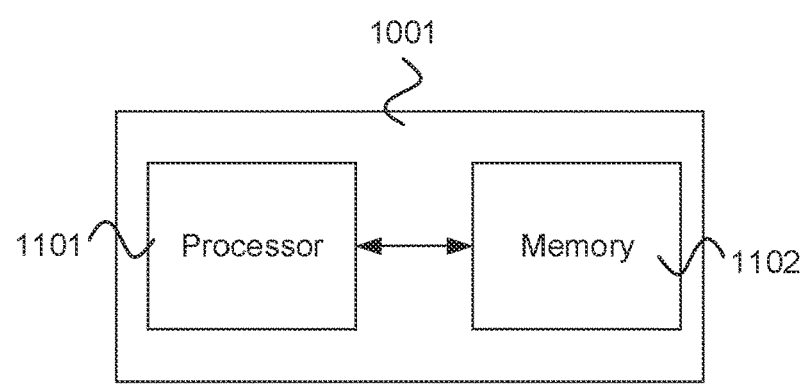
FIG. 10 illustrates a schematic representation of a control unit, according to an embodiment.

Although the connection between the arrangement 100 and the control unit 1001 is schematically illustrated as a single connection in the embodiment of FIG. 10, the connection may comprise any number of connections. For example, the control unit 1001 may be coupled to the at least one qubit 101, to the filter 102, and/or to the energy dissipation structure 103.

FIG. 10 illustrates a schematic representation of a control unit 1001, according to an embodiment. The control unit 1001 may comprise at least one processor 1101. The at least one processor 1101 may include, for example, one or more of various processing devices, such as a co-processor, a microprocessor, a control unit 1001, a digital signal processor (DSP), processing circuitry with or without an accompanying DSP, or various other processing devices including integrated circuits such as, for example, an application specific integrated circuit (ASIC), a field programmable gate array (FPGA), a microprocessor unit (MCU), a hardware accelerator, a special-purpose computer chip, or the like.

The control unit 1001 may further comprise a memory 1102. The memory 1102 may be configured to store, for example, computer programs and the like. The memory 1102 may comprise one or more volatile memory devices, one or more non-volatile memory devices, and/or a combination of one or more volatile memory devices and non-volatile memory devices. For example, the memory 1102 may be embodied as magnetic storage devices (such as hard disk drives, floppy disks, magnetic tapes, etc.), optical magnetic storage devices, and semiconductor memories (such as mask ROM, PROM (programmable ROM), EPROM (erasable PROM), flash ROM, RAM (random access memory), etc.).

The control unit 1001 may further comprise other components not illustrated in the embodiment of FIG. 10. The control unit 1001 may comprise, for example, an input/output bus for connecting the control unit 1001 to the arrangement 100. Further, a user may control the control unit 1001 via the input/output bus. The user may, for example, control quantum computation operations performed by the arrangement 100 via the control unit 1001 and the input/output bus.

When the control unit 1001 is configured to implement some functionality, some component and/or components of the control unit 1001, such as the at least one processor 1101 and/or the memory 1102, may be configured to implement this functionality. Furthermore, when the at least one processor 1101 is configured to implement some functionality, this functionality may be implemented using program code stored, for example, in the memory 1102. The control unit 1001 may be implemented using, for example, a computer, some other computing device, or similar.

Figure 11:
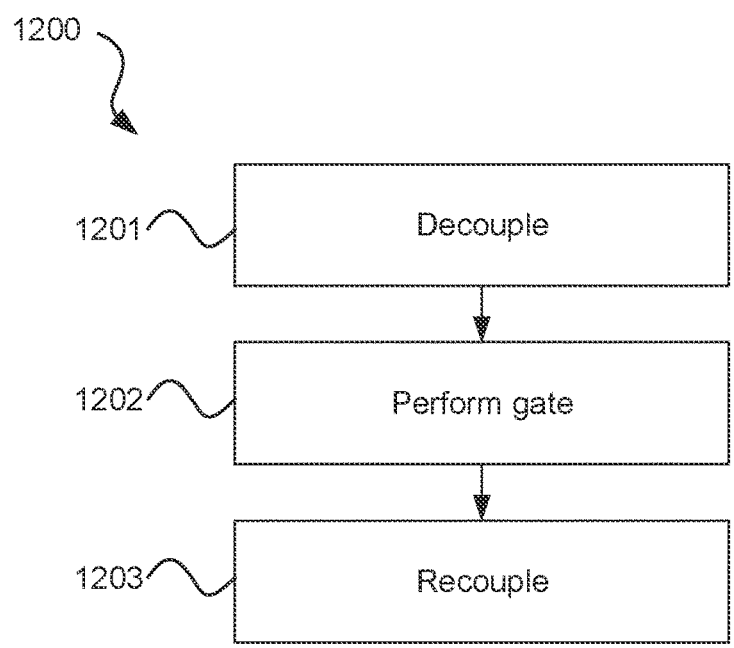
FIG. 11 illustrates a flowchart representation of a method for qubit leakage error reduction using at least one arrangement or apparatus, according to an embodiment.

FIG. 11 illustrates a flowchart representation of a method 1200 for qubit leakage error reduction using at least one arrangement 100, according to an embodiment. The method 1200 may include decoupling a filter and/or an energy dissipation structure from a qubit 101 (block 1201). The method 1200 may further include performing at least one gate operation on the qubit (block 1202).

The method 1200 may further include recoupling the filter and/or the energy dissipation structure to the qubit (block 1203). The at least one qubit 101 may be decoupled from the filter and/or the energy dissipation structure all the time except at specific "leakage removal times" when the coupling to the energy dissipation structure is turned on for a time sufficient to remove the leakage. After leakage removal, the at least one qubit 101 is again decoupled. The frequency at which these "leakage removal times" occur can depend on the amount of leakage that is accumulated in the at least one qubit 101 during quantum computation(s). Thus, the leakage removal may be performed, for example, after every gate, after two gates, after three gates etc.

The at least one arrangement may include a plurality of arrangements. This may be the case, for example, in a quantum computing system comprising a plurality of qubits where each qubit can be implemented using the arrangement 100. In such a case, the method 1200 may be performed on each such arrangement to remove leakage error from each qubit in the plurality of qubits.

The method 1200 may comprise decoupling a filter and/or an energy dissipation structure from a qubit in each arrangement in the plurality of arrangements (block 1201). The method 1200 may further comprise performing at least one of a single-qubit gate operation or multi-qubit gate operations using the qubit in each arrangement in the plurality of arrangements (block 1202).

The method 1200 may further comprise recoupling the filter and/or the energy dissipation structure to the qubit in each arrangement in the plurality of arrangements (block 1203). The method 1200 may be performed by, for example, the control unit 1001 or any other device capable of controlling the at least one arrangement.

In a different embodiment, only one or more qubits within the plurality of qubits is coupled to their filter and/or dissipation structure for leakage error removal, while other qubits within the plurality of qubits remain decoupled. In a yet different embodiment, the plurality of qubits may be coupled or decoupled to a common filter and/or dissipation structure.

Any range or device value given herein may be extended or altered without losing the effect sought. Also any embodiment may be combined with another embodiment unless explicitly disallowed.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts are intended to be within the scope of the claims.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item may refer to one or more of those items.

The steps of the methods described herein may be carried out in any suitable order, or simultaneously where appropriate. Additionally, individual blocks may be deleted from any of the methods without departing from the spirit and scope of the subject matter described herein. Aspects of any of the embodiments described above may be combined with aspects of any of the other embodiments described to form further embodiments without losing the effect sought.

The term 'comprising' is used herein to mean including the method, blocks or elements identified, but that such blocks or elements do not comprise an exclusive list and a method or apparatus may contain additional blocks or elements.

It will be understood that the above description is given by way of example only and that various modifications may be made by those skilled in the art. The above specification, examples and data provide a complete description of the structure and use of exemglary embodiments. Although various embodiments have been described above with a certain degree of particularity, or with reference to one or more individual embodiments, those skilled in the art could make numerous alterations to the disclosed embodiments without departing from the spirit or scope of this specification.

The invention claimed is:

1. An apparatus for reducing qubit leakage errors comprising:
  at least one qubit having a ground state and a plurality of excited states, wherein the plurality of excited states includes a lowest excited state, wherein an energy difference between the ground state and the lowest excited state corresponds to a first frequency, and an energy difference between the lowest excited state and another excited state in the plurality of excited states corresponds to a second frequency;
  an energy dissipation structure configured to dissipate energy transferred to the energy dissipation structure; and a filter having at least one stopband and at least one passband, wherein the filter is coupled to the at least one qubit and to the energy dissipation structure, and wherein the at least one stopband includes the first frequency and the at least one passband comprises the second frequency, wherein the energy dissipation structure is controllably coupled to the at least one qubit via the filter and configured to be tuned for decoupling from the at least one qubit.

2. The apparatus according to claim 1, wherein the energy dissipation structure comprises at least one normal metal—insulator—superconductor (NIS) junction.

3. The apparatus according to claim 1, wherein the energy dissipation structure comprises a quantum circuit refrigerator (QCR), wherein the QCR includes a voltage-biased superconductor—insulator—normal metal—insulator—superconductor (SINIS) junction.

4. The apparatus according claim 3, wherein the energy dissipation structure is configured to dissipate photon energy transferred to the energy dissipation structure via photon-assisted electron tunnelling in the SINIS junction.

5. The apparatus according claim 2, wherein the energy dissipation structure is configured to dissipate photon energy transferred to the energy dissipation structure via photon-assisted electron tunnelling in the NIS junction.

6. The apparatus according to claim 1, wherein the filter comprises a band-stop filter or a low-pass filter.

7. The apparatus according to claim 1, wherein the at least one qubit comprises a superconductive qubit.

8. The apparatus according to claim 1, wherein the other excited state comprises a second lowest excited state of the at least one qubit.

9. The apparatus according to claim 1, wherein the at least one passband of the filter further comprises a third frequency corresponding to an energy difference between two states in the plurality of excited states.

10. The apparatus according to claim 1, wherein the at least one passband of the filter further comprises a first plurality of frequencies, wherein each frequency in the first plurality of frequencies corresponds to an energy difference between two consecutive excited states in the plurality of excited states of the at least one qubit.

11. The apparatus according to claim 10, wherein the at least one stopband of the filter further comprises a second plurality of frequencies, wherein each frequency in the second plurality of frequencies corresponds to an energy difference between two non-consecutive states of the at least one qubit.

12. A quantum computing device comprising the apparatus according to claim 1.

13. A quantum computing system comprising:
the apparatus according to claim 1; and
a control unit coupled to the apparatus,
wherein the control unit is configured to decouple at least one of the filter or the energy dissipation structure from the at least one qubit in response to a gate operation on the at least one qubit.

14. The quantum computing system according to claim 13, further comprising a plurality of apparatuses,
wherein each apparatus in the plurality of apparatuses is implemented according to claim 1,
wherein the control unit is coupled to each apparatus in the plurality of apparatuses, and
wherein the control unit is further configured to decouple at least one of the filter or the energy dissipation structure of each apparatus in the plurality of apparatuses from the at least one qubit of the apparatus in response to a gate operation on the qubit.

15. A method for qubit leakage error reduction using at least one apparatus according to claim 1, the method comprising:
decoupling at least one of the filter or the energy dissipation structure from the at least one qubit; and
performing at least one gate operation on the qubit.

16. The method according to claim 15, further comprising recoupling at least one of the filter or the energy dissipation structure to the at least one qubit after the at least one gate operation is performed.

17. The method according to claim 14, wherein the at least one apparatus comprises a plurality of apparatuses, the method further comprising:
decoupling at least one of the filter or the energy dissipation structure from the at least one qubit in each apparatus in the plurality of apparatuses; and
performing at least one multi-qubit gate operation using the at least one qubit in each apparatus in the plurality of apparatuses.

18. The method according to claim 17, further comprising recoupling at least one of the filter or the energy dissipation structure to the at least one qubit in each apparatus in the plurality of apparatuses after the at least one multi-qubit gate operation is performed.

* * * * *